(12) United States Patent
Wu

(10) Patent No.: US 10,276,453 B1
(45) Date of Patent: Apr. 30, 2019

(54) CIRCUITS CONSTRUCTED FROM STACKED FIELD-EFFECT TRANSISTORS

(71) Applicant: GLOBALFOUNDRIES Inc., Grand Cayman (KY)

(72) Inventor: Nan Wu, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/922,321

(22) Filed: Mar. 15, 2018

(51) Int. Cl.
| | |
|---|---|
| H01L 27/092 | (2006.01) |
| H01L 21/8238 | (2006.01) |
| H01L 29/78 | (2006.01) |
| H01L 29/06 | (2006.01) |
| H01L 29/66 | (2006.01) |
| H01L 21/28 | (2006.01) |
| H01L 21/3213 | (2006.01) |

(52) U.S. Cl.
CPC ........ H01L 21/823885 (2013.01); H01L 21/28123 (2013.01); H01L 21/32139 (2013.01); H01L 21/823821 (2013.01); H01L 21/823828 (2013.01); H01L 27/0924 (2013.01); H01L 29/0649 (2013.01); H01L 29/66666 (2013.01); H01L 29/7827 (2013.01)

(58) Field of Classification Search
CPC ........... H01L 27/0924; H01L 27/0886; H01L 21/823431; H01L 21/823821
See application file for complete search history.

(56) References Cited

U.S. PATENT DOCUMENTS 5,315,143 A * 5/1994 Tsuji .................. H01L 27/092
257/351
8,294,511 B2 * 10/2012 Juengling ....... H01L 21/823431
327/566
9,755,071 B1 9/2017 Anderson et al.
2016/0211264 A1* 7/2016 Peng .................. H01L 21/8221
2017/0141113 A1* 5/2017 Sagong ............... H01L 27/0922

OTHER PUBLICATIONS

Hsieh et al., "First Demonstration of Flash RRAM on Pure CMOS Logic 14nm FinFET Platform Featuring Excellent Immunity to Sneak-path and MLC Capability" 2017 Symposium on VLSI Technology Digest of Technical Papers.
Loubet et al., "Stacked Nanosheet Gate-All-Around Transistor to Enable Scaling Beyond FinFET", 2017 Symposium on VLSI Technology Digest of Technical Papers.
3DIC.org, "Cool Cube" retrieved from the internet on Mar. 15, 2018 at www.3dic.org/CoolCube.

* cited by examiner

*Primary Examiner* — Grant S Withers
(74) *Attorney, Agent, or Firm* — Thompson Hine LLP

(57) ABSTRACT

Structures that include vertically-arranged field-effect transistors and methods for forming a structure that includes vertically-arranged field-effect transistors. A first field-effect transistor includes a section of a first fin, a first source/drain region, and a second source/drain region. The section of the first fin is arranged between the first source/drain region and the second source/drain region of the first field-effect transistor. A second field-effect transistor includes a second fin arranged over the section of the first fin, a first source/drain region, and a second source/drain region. A functional gate structure has an overlapping arrangement with the section of the first fin and also has an overlapping arrangement with a section of the second fin that is arranged between the first source/drain region and the second source/drain region of the second field-effect transistor.

20 Claims, 13 Drawing Sheets

CIRCUITS CONSTRUCTED FROM STACKED FIELD-EFFECT TRANSISTORS

BACKGROUND

The present invention relates to semiconductor device fabrication and integrated circuits and, more specifically, to structures that include vertically-arranged field-effect transistors and methods for forming a structure that includes vertically-arranged field-effect transistors.

Traditional complementary metal-oxide-semiconductor (CMOS) structures for a field-effect transistor include a source, a drain, a channel situated between the source and drain, and a gate electrode configured to respond to a gate voltage by selectively connecting the source and drain to each other through the channel. Field-effect transistor structures can be broadly categorized based upon the orientation of the channel relative to a surface of a semiconductor substrate associated with their formation. Planar field-effect transistors and fin-type field-effect transistors constitute a category of transistor structures in which the flow of gated current in the channel is oriented in a horizontal direction parallel to the substrate surface.

SUMMARY

In an embodiment, a structure includes a first field-effect transistor with a section of a first fin, a first source/drain region, and a second source/drain region. The section of the first fin is arranged between the first source/drain region and the second source/drain region of the first field-effect transistor. The structure further includes a second field-effect transistor with a second fin arranged over the section of the first fin, a first source/drain region, and a second source/drain region. A functional gate structure has an overlapping arrangement with the section of the first fin, and also has an overlapping arrangement with a section of the second fin arranged between the first source/drain region and the second source/drain region of the second field-effect transistor.

In an embodiment, a method includes forming a first fin, epitaxially growing a first source/drain region and a second source/drain region of a first field-effect transistor from the first fin, forming a second fin over the first fin, and epitaxially growing a first source/drain region and a second source/drain region of a second field-effect transistor from the second fin. The method further includes forming a functional gate structure that overlaps with a section of the first fin between the first source/drain region and the second source/drain region of the first field-effect transistor, and that overlaps with a section of the second fin between the first source/drain region and the second source/drain region of the second field-effect transistor.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
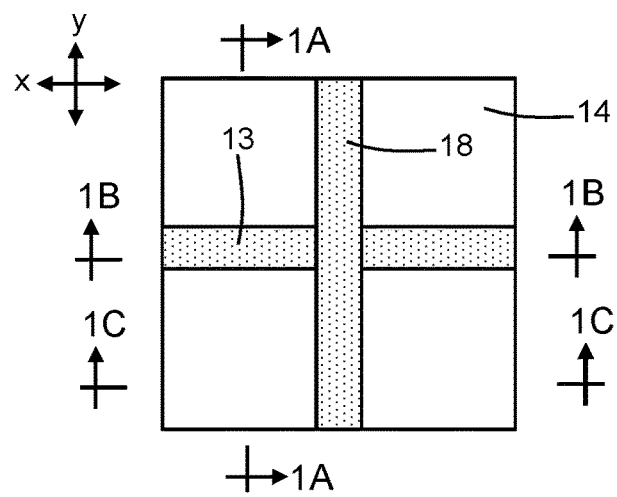
FIG. 1 is a top view of a structure at an initial fabrication stage of a processing method in accordance with embodiments of the invention.
Figure 1A:
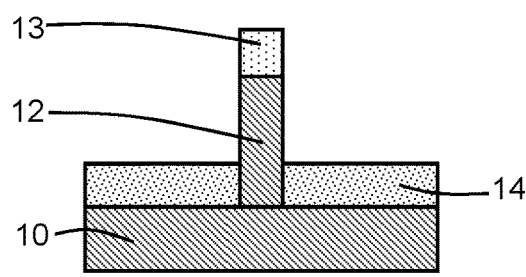
FIG. 1A is a cross-sectional view taken generally along line 1A-1A in FIG. 1.
Figure 1B:
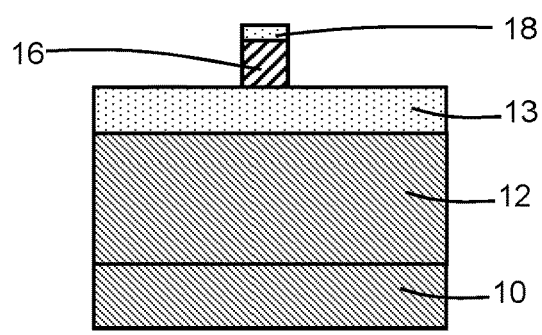
FIG. 1B is a cross-sectional view taken generally along line 1B-1B in FIG. 1.
Figure 1C:
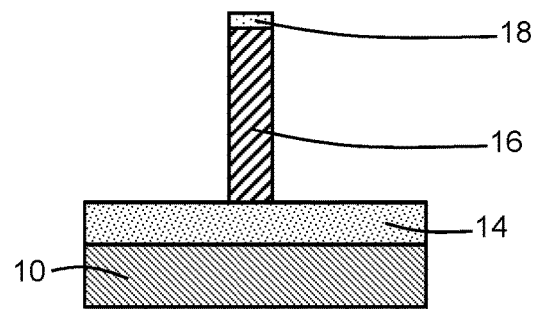
FIG. 1C is a cross-sectional view taken generally along line 1C-1C in FIG. 1.

With reference to FIGS. 1, 1A, 1B, 1C and in accordance with embodiments of the invention, a fin 12 projects in a vertical direction from a substrate 10. The fin 12 may be formed from semiconductor material, such as the semiconductor material of the substrate 10, that is patterned using photolithography and etching processes, such as a sidewall imaging transfer (SIT) process or self-aligned double patterning (SADP), and cut into given lengths in the layout. The fin 12 may include a cap 13 formed as part of the patterning process. The cap 13 may be composed of a dielectric material, such as silicon nitride ($Si_3N_4$). The substrate 10 may be composed of a single crystal semiconductor material, and may be a bulk silicon substrate or a device layer of a silicon-on-insulator substrate. The fin 12 extends in a longitudinal direction along its length, such as in the x-direction in an x-y coordinate frame.

A dielectric layer 14 is arranged over the substrate 10. The dielectric layer 14 may be composed of a dielectric material, such as silicon nitride ($Si_3N_4$), that is deposited by chemical vapor deposition (CVD) and recessed with an etching process. The fin 12 extends in the vertical direction through the thickness of the dielectric layer 14 and has a section that protrudes above the dielectric layer 14.

A sacrificial gate structure 16 is formed that extends across the fin 12 and onto the dielectric layer 14 adjacent to the fin 12. The sacrificial gate structure 16 may extend in a direction along its length, such as the y-direction in the x-y coordinate frame, that is orthogonal to the longitudinal direction along which the fin 12 extends. The sacrificial gate structure 16 may be a placeholder structure for a functional gate structure that is formed in a subsequent processing stage. The formation of the sacrificial gate structure 16 may include depositing a blanket layer of a sacrificial material, such as amorphous silicon or polysilicon by chemical vapor deposition (CVD), and patterning the deposited blanket layer using sections of a hardmask as an etch mask and an etching process, such as reactive ion etching (RIE). The sacrificial gate structure 16 may be covered by a cap 18 representing a hardmask section that remains after patterning.

With reference to FIGS. 2, 2A, 2B, 2C in which like reference numerals refer to like features in FIGS. 1, 1A, 1B, 1C and at a subsequent fabrication stage of the processing method, sidewall spacers 20 are formed adjacent to the sidewalls of the sacrificial gate structure 16. The sidewall spacers 20 may be composed of a dielectric material, such as silicon nitride ($Si_3N_4$) or a low-k dielectric material having a dielectric constant (i.e., permittivity) that is less than the dielectric constant of silicon nitride ($Si_3N_4$). The sidewall spacers 20 may be formed by depositing a conformal layer by atomic layer deposition (ALD) and etching with an etching process, such as reactive ion etching (RIE).

Source/drain regions 21, 22 are formed by an epitaxial growth process on the fin 12 arranged on opposite sides of the sacrificial gate structure 16 and above the dielectric layer 14. The source/drain regions 21, 22 extend along the length of the fin 12. The cap 13 prohibits epitaxial growth from the top surface of the fin 12, and the cap 18 and sidewall spacers 20 prohibit epitaxial growth from the sacrificial gate structure 16. In an embodiment, the source/drain regions 21, 22 may be formed by selective epitaxial growth (SEG) process in which the constituent semiconductor material nucleates for epitaxial growth on semiconductor surfaces (e.g., fin 12), but does not nucleate for epitaxial growth from insulator surfaces (e.g., cap 13, cap 18, and sidewall spacers 20). The source/drain regions 21, 22 may be sections of epitaxially-grown semiconductor material containing a concentration of an n-type dopant from Group V of the Periodic Table (e.g., phosphorus (P) and/or arsenic (As)) that provides n-type electrical conductivity. Alternatively, the source/drain regions 21, 22 may be sections of epitaxially-grown semiconductor material containing a concentration of a p-type dopant from Group III of the Periodic Table (e.g., boron (B), aluminum (Al), gallium (Ga), and/or indium (In)) that provides p-type electrical conductivity.

Figure 2:
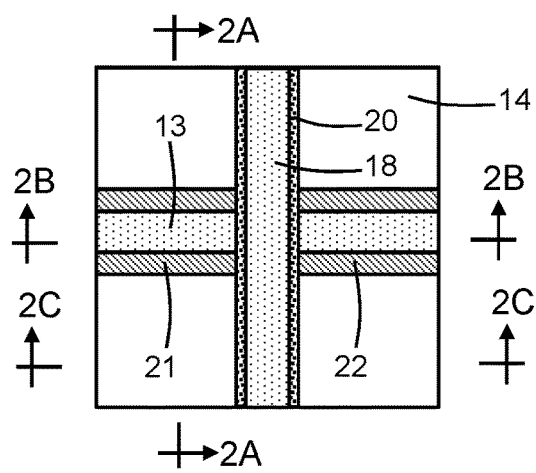
FIG. 2 is a top view showing a structure at a fabrication stage of the processing method subsequent to the fabrication stage of FIG. 1.
Figure 2A:
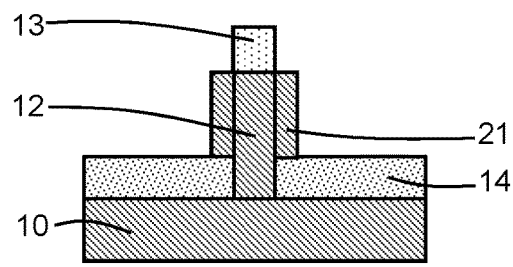
FIG. 2A is a cross-sectional view taken generally along line 2A-2A in FIG. 2.
Figure 2B:
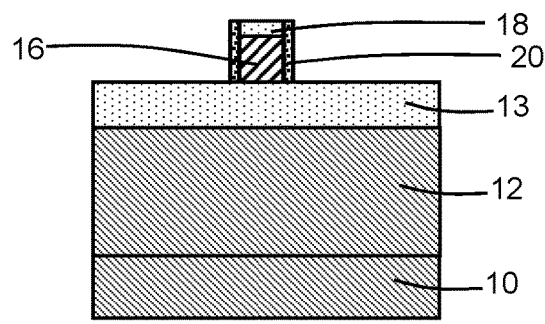
FIG. 2B is a cross-sectional view taken generally along line 2B-2B in FIG. 2.
Figure 2C:
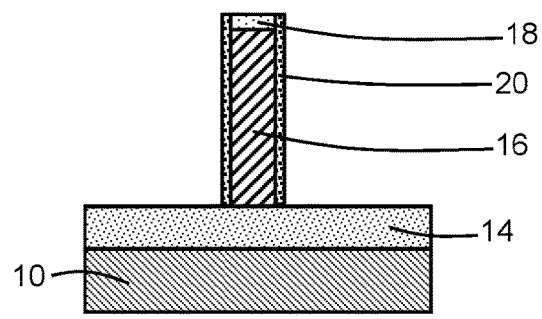
FIG. 2C is a cross-sectional view taken generally along line 2C-2C in FIG. 2.
Figure 3A:
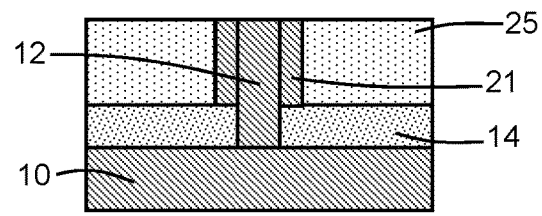
FIGS. 3A, 3B, 3C are cross-sectional views of the structure at a fabrication stage of the processing method respectively subsequent to FIGS. 2A, 2B, 2C.
Figure 3B:
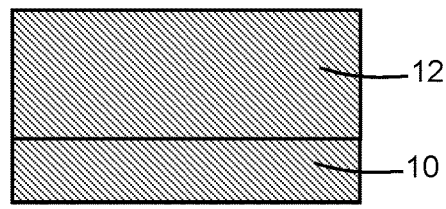
Figure 3C:
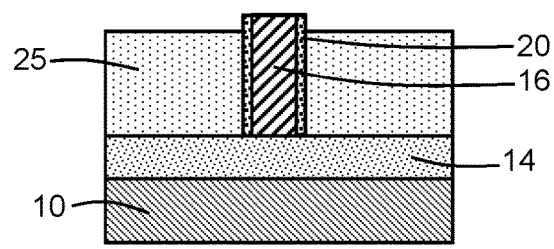

With reference to FIGS. 3A, 3B, 3C in which like reference numerals refer to like features in FIGS. 2A, 2B, 2C and at a subsequent fabrication stage of the processing method, a dielectric layer 25 is formed over the fin 12, source/drain regions 21, 22, and sacrificial gate structure 16 after the source/drain regions 21, 22 are epitaxially grown. The dielectric layer 25 may be composed of a dielectric material, such as silicon dioxide ($SiO_2$), deposited by a chemical vapor deposition (CVD) process and planarized by chemical mechanical polishing (CMP) to have a top surface that is coplanar with the cap 18 on the sacrificial gate structure 16. The dielectric layer 25 is further planarized by chemical mechanical polishing (CMP) to be coplanar with the cap 13 on the fin 12, which removes the cap 18 from the sacrificial gate structure 16 and reduces the height of the sacrificial gate structure 16. The cap 13 is removed from the fin 12 by an etching process. The etching process used to remove the cap 13 may further recess the dielectric layer 25.

Figure 4A:
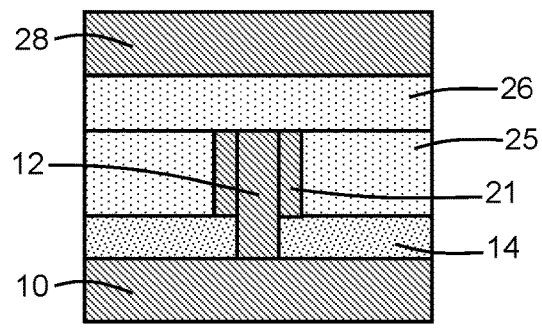
FIGS. 4A, 4B, 4C are cross-sectional views of the structure at a fabrication stage of the processing method respectively subsequent to FIGS. 3A, 3C, 3C.
Figure 4B:
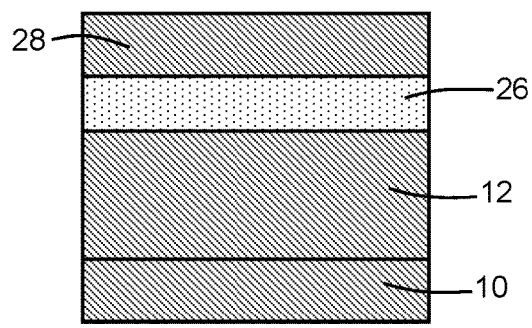
Figure 4C:
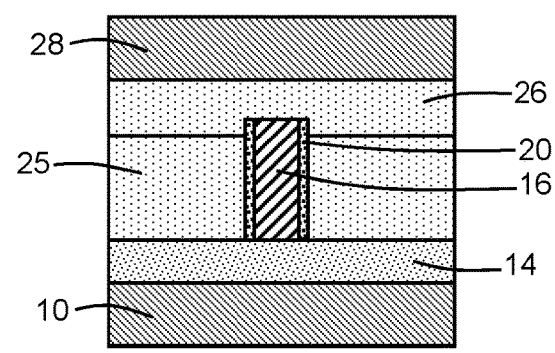
Figure 5:
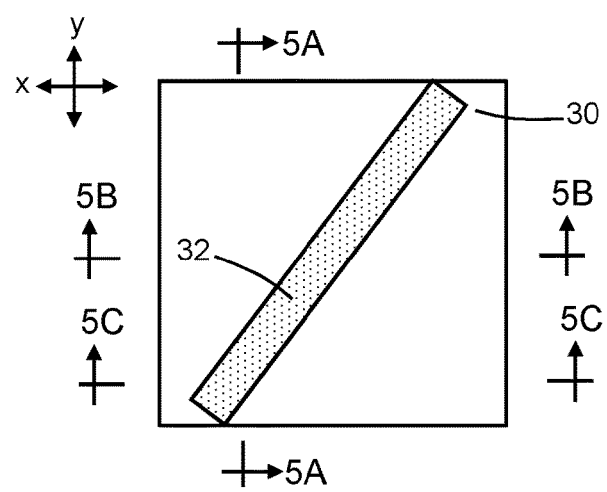
FIG. 5 is a top view showing a structure at a fabrication stage of the processing method subsequent to the fabrication stage of FIGS. 4A, 4B, 4C.
Figure 5A:
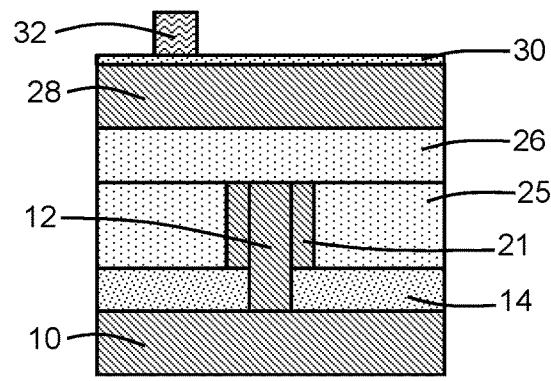
FIG. 5A is a cross-sectional view taken generally along line 5A-5A in FIG. 5.
Figure 5B:
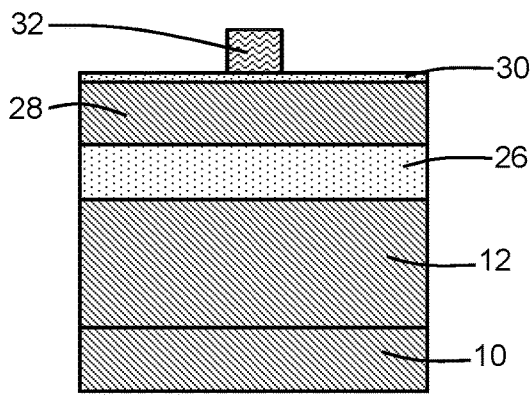
FIG. 5B is a cross-sectional view taken generally along line 5B-5B in FIG. 5.
Figure 5C:
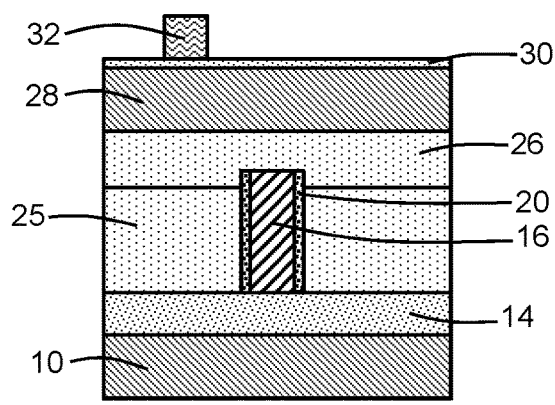
FIG. 5C is a cross-sectional view taken generally along line 5C-5C in FIG. 5.

With reference to FIGS. 4A, 4B, 4C in which like reference numerals refer to like features in FIGS. 3A, 3B, 3C and at a subsequent fabrication stage of the processing method, a dielectric layer 26 is formed over the fin 12, source/drain regions 21, 22, and sacrificial gate structure 16. The dielectric layer 26 may be composed of a dielectric material, such as silicon dioxide ($SiO_2$), deposited by chemical vapor deposition (CVD) and planarized by chemical mechanical polishing (CMP) to have a planar top surface.

A semiconductor layer 28 representing a device layer of a silicon-on-insulator substrate may be transferred from the silicon-on-insulator substrate and bonded to the top surface of the dielectric layer 26. The handle wafer and buried oxide layer of the silicon-on-insulator substrate may be removed by grinding, polishing, and/etching from the back side opposite to the front side that is attached by bonding to the dielectric layer 26.

With reference to FIGS. 5, 5A, 5B, 5C in which like reference numerals refer to like features in FIGS. 4A, 4B, 4C and at a subsequent fabrication stage of the processing method, a dielectric layer 30 is formed on the semiconductor layer 28 and an etch mask 32 is formed by lithography over the dielectric layer 30. The dielectric layer 30 may be composed of a dielectric material, such as silicon dioxide ($SiO_2$), deposited by chemical vapor deposition (CVD). The etch mask 32 may be comprised of a layer of a light-sensitive material, such as an organic photoresist, applied by a spin coating process, pre-baked, exposed to light projected through a photomask, baked after exposure, and developed with a chemical developer. The etch mask 32 may also include an anti-reflective coating and a spin-on hardmask, such as an organic planarization layer (OPL), that are patterned along with the photoresist. The etch mask 32 covers a strip of the semiconductor layer 28 that is skewed at an angle relative to the longitudinal direction along the length of the fin 12.

With reference to FIGS. 6, 6A, 6B, 6C in which like reference numerals refer to like features in FIGS. 5, 5A, 5B, 5C and at a subsequent fabrication stage of the processing method, an etching process, such as reactive ion etching (RIE), is used to pattern the dielectric layer 30, the semiconductor layer 28, and the dielectric layer 26. The patterning of the semiconductor layer 28 defines a fin 34 over an area of the semiconductor layer 28 that is masked and protected by the etch mask 32. The fin 34 is aligned at an angle (i.e., inclined or angled) relative to the length of the fin 12. A residual patterned section of the dielectric layer 30 is arranged as a cap on the fin 34, and a residual patterned section of the dielectric layer 26 is arranged between the fin 34 and the fin 12. The etch mask 32 is stripped following the conclusion of the etching process forming the fin 34.

The fin 34 is not arranged parallel to or perpendicular to the fin 12. Instead, the fin 34 is inclined at angle, θ, in the x-y plane relative to the longitudinal direction of the sacrificial gate structure 16 and at a complementary acute angle in the x-y plane relative to the longitudinal direction of the fin 12. The inclination of the fin 34 relative to the fin 12 is established by the alignment during lithography of the etch mask 32 relative to the fin 12. Generally, the fin 34 is arranged over the fin 12 in an upper level of the structure and is aligned to extend across the fin 12 in a lower level of the structure with a vertical displacement to provide an overlap and vertically-displaced intersection (i.e., overlap in a vertical direction) between the fins 12 and 34. The overlap facilitates the formation of a single functional gate structure that is shared between the lower field-effect transistor formed from fin 12 and the upper field-effect transistor formed from fin 34.

Figure 6:
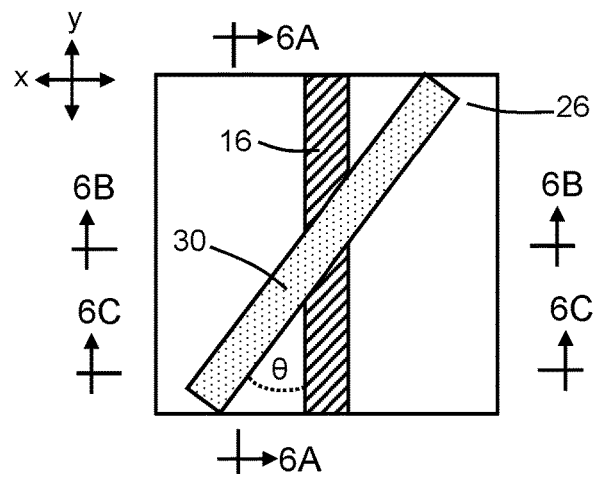
FIG. 6 is a top view of the structure at a fabrication stage of the processing method subsequent to the fabrication stage of FIG. 5.
Figure 6A:
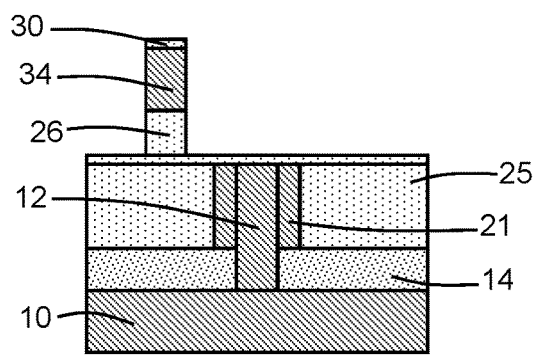
FIG. 6A is a cross-sectional view taken generally along line 6A-6A in FIG. 6.
Figure 6B:
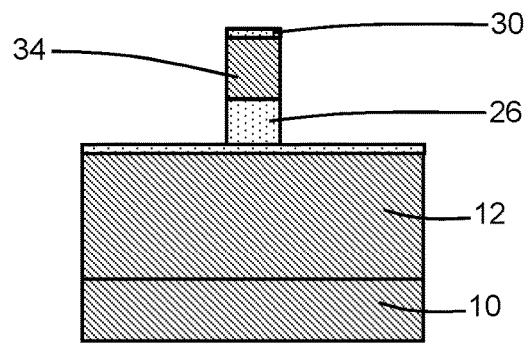
FIG. 6B is a cross-sectional view taken generally along line 6B-6B in FIG. 6.
Figure 6C:
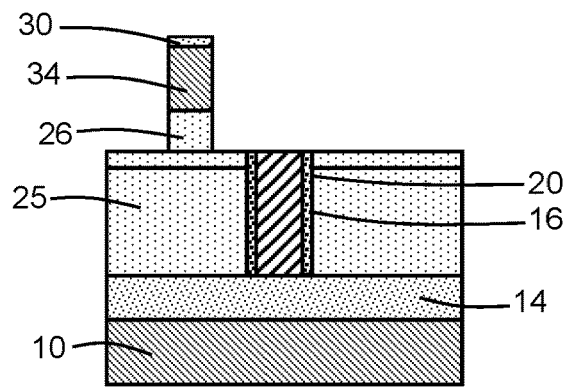
FIG. 6C is a cross-sectional view taken generally along line 6C-6C in FIG. 6.
Figure 7A:
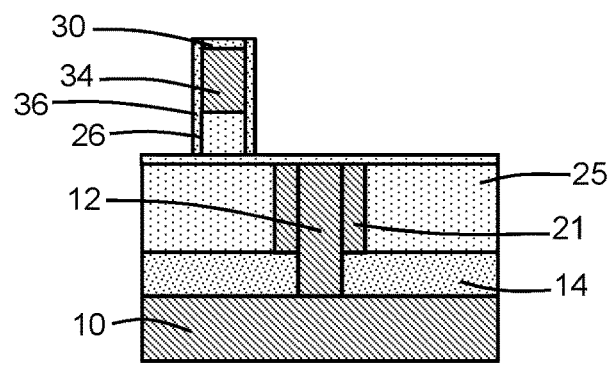
FIGS. 7A, 7B, 7C are cross-sectional views of the structure at a fabrication stage of the processing method respectively subsequent to FIGS. 6A, 6B, 6C.
Figure 7B:
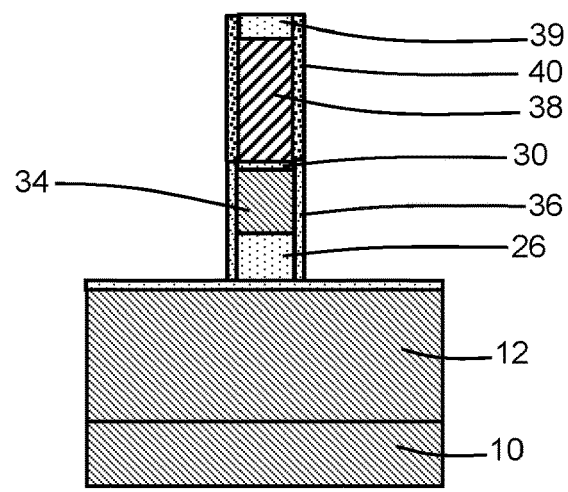
Figure 7C:
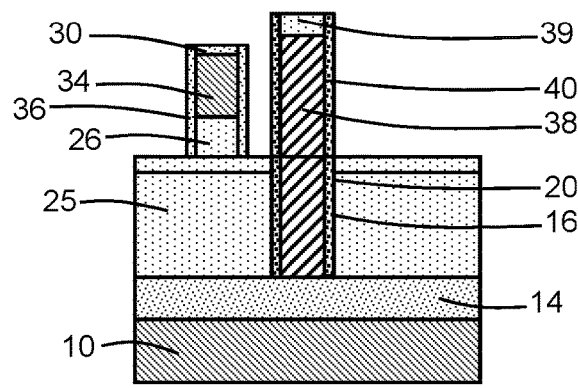

With reference to FIGS. 7A, 7B, 7C in which like reference numerals refer to like features in FIGS. 6A, 6B, 6C and at a subsequent fabrication stage of the processing method, sidewall spacers 36 are formed at the sidewalls of the fin 34. The sidewall spacers 36 may be composed of a dielectric material, such as silicon dioxide ($SiO_2$), that is deposited as a conformal layer by, for example, atomic layer deposition (ALD) and then etched with an etching process, such as reactive ion etching (RIE).

A sacrificial gate structure 38 is formed by lithography and etching as another placeholder structure for a functional gate structure that is formed in a subsequent fabrication stage. The sacrificial gate structure 38 extends across the fin 34 and onto the dielectric layer 30. The sacrificial gate structure 38 is aligned with the sacrificial gate structure 16 such that the sacrificial gate structures 16, 38 form a continuous pillar. The formation of the sacrificial gate structure 38 may include depositing a blanket layer of a sacrificial material, such as amorphous silicon or polysilicon by chemical vapor deposition (CVD), and patterning this layer using sections of a hardmask as an etch mask and an anisotropic etching process, such as reactive ion etching (RIE). The sacrificial gate structure 38 may be covered by a cap 39 representing a hardmask section that remains after patterning.

Sidewall spacers 40 are formed adjacent to the sidewalls of the sacrificial gate structure 38. The sidewall spacers 40 are aligned with the sidewall spacers 20 due to the alignment of the sacrificial gate structures 16, 38. The sidewall spacers 40 may be composed of a dielectric material, such as silicon nitride ($Si_3N_4$) or a low-k dielectric material having a dielectric constant (i.e., permittivity) less than the dielectric constant of silicon nitride ($Si_3N_4$). The sidewall spacers 40 may be formed by depositing a conformal layer by atomic layer deposition (ALD) and etching with an etching process, such as reactive ion etching (RIE).

With reference to FIGS. 8, 8A, 8B, 8C in which like reference numerals refer to like features in FIGS. 7A, 7B, 7C and at a subsequent fabrication stage of the processing method, the sidewall spacers 36 are removed from the sidewalls of the fin 34 by, for example, an etching process. Source/drain regions 42, 43 are formed by an epitaxial growth process on the fin 12 arranged on opposite sides of the sacrificial gate structure 16 and above the dielectric layer 14. The cap 39 prevents epitaxial growth from the top surface of the fin 34, and the cap 39 and sidewall spacers 40 prohibit epitaxial growth from the sacrificial gate structure 38. In an embodiment, the source/drain regions 42, 43 may be formed by selective epitaxial growth (SEG) process in which the constituent semiconductor material nucleates for epitaxial growth on semiconductor surfaces (e.g., fin 34), but does not nucleate for epitaxial growth from insulator surfaces (e.g., cap 39 and sidewall spacers 40).

The source/drain regions 42, 43 have an opposite conductivity type from the source/drain regions 21, 22. If the source/drain regions 21, 22 are composed of semiconductor material with p-type electrical conductivity, the source/drain regions 42, 43 may be sections of epitaxially-grown semiconductor material containing a concentration of an n-type dopant from Group V of the Periodic Table (e.g., phosphorus (P) and/or arsenic (As)) that provides n-type electrical conductivity. Alternatively, if the source/drain regions 21, 22 are composed of semiconductor material with n-type electrical conductivity, the source/drain regions 42, 43 may be sections of epitaxially-grown semiconductor material containing a concentration of a p-type dopant from Group III of the Periodic Table (e.g., boron (B), aluminum (Al), gallium (Ga), and/or indium (In)) that provides p-type electrical conductivity.

Figure 8:
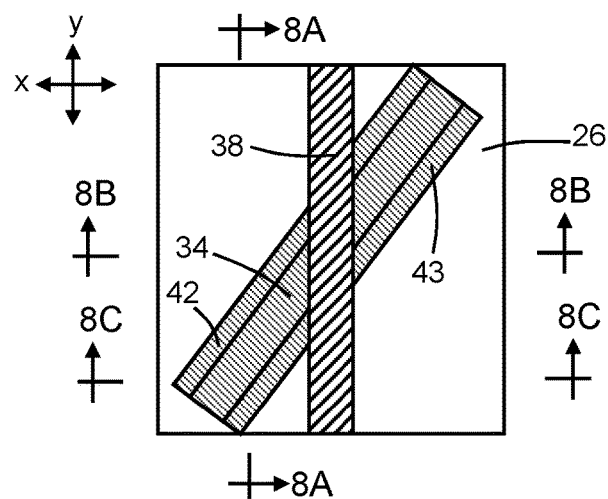
FIG. 8 is a top view of the structure at a fabrication stage of the processing method subsequent to the fabrication stage of FIGS. 7A, 7B, 7C.
Figure 8A:
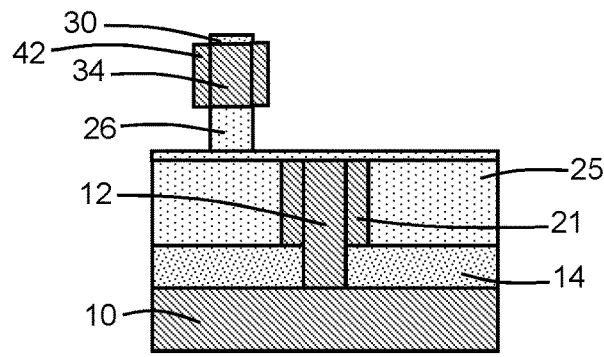
FIG. 8A is a cross-sectional view taken generally along line 8A-8A in FIG. 8.
Figure 8B:
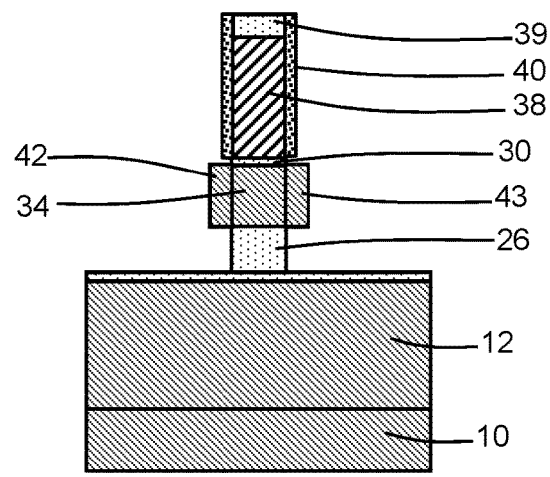
FIG. 8B is a cross-sectional view taken generally along line 8B-8B in FIG. 8.
Figure 8C:
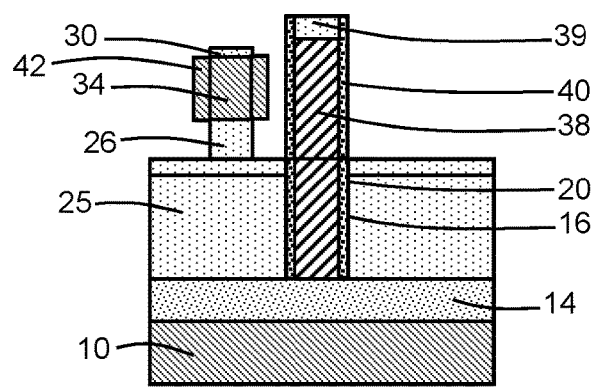
FIG. 8C is a cross-sectional view taken generally along line 8C-8C in FIG. 8.
Figure 9A:
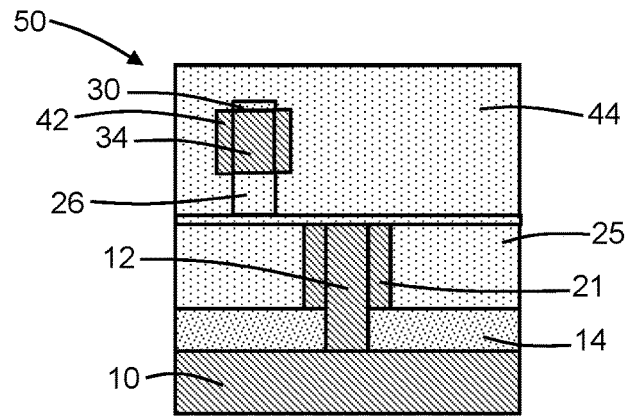
FIGS. 9A, 9B, 9C are cross-sectional views of the structure at a fabrication stage of the processing method respectively subsequent to FIGS. 8A, 8B, 8C.
Figure 9B:
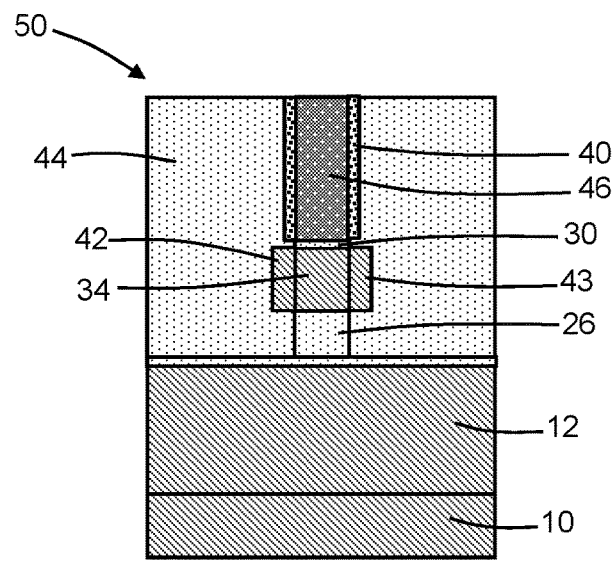
Figure 9C:
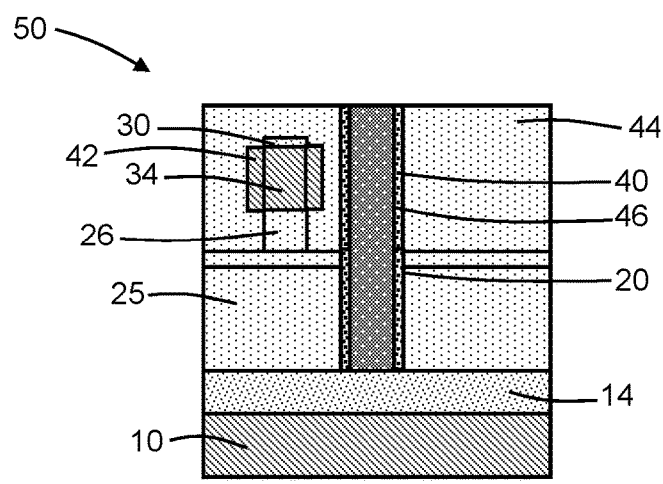

With reference to FIGS. 9A, 9B, 9C in which like reference numerals refer to like features in FIGS. 8A, 8B, 8C and at a subsequent fabrication stage of the processing method, after the source/drain regions 42, 43 are epitaxially grown from the fin 34, a dielectric layer 44 is formed over the fin 12, source/drain regions 42, 43, and sacrificial gate structure 38. The dielectric layer 44 may be composed of a dielectric material, such as silicon dioxide ($SiO_2$), deposited by a flowable chemical vapor deposition (FCVD) process and planarized by chemical mechanical polishing (CMP) to have a top surface that is coplanar with the cap 39 on the sacrificial gate structure 38.

A replacement metal gate process is performed that removes the cap 39 and the stacked sacrificial gate structures 16, 38 and that replaces both of the stacked sacrificial gate structures 16, 38 with a functional gate structure 46 to complete a device structure 50. The functional gate structure 46 may include a metal gate electrode and a gate dielectric layer arranged between the metal gate electrode and the exterior surfaces of the fins 12, 34. The metal gate electrode may include one or more conformal barrier metal layers and/or work function metal layers, such as layers composed of titanium aluminum carbide (TiAlC) and/or titanium nitride (TiN), and a metal gate fill layer composed of a conductor, such as tungsten (W). The gate dielectric layer may be composed of a dielectric material, such as a high-k dielectric like hafnium oxide ($HfO_2$).

The device structure 50 includes field-effect transistors of complementary conductivity types that are vertically stacked and that share the functional gate structure 46. One of the field-effect transistors includes the fin 12 and the source/drain regions 21, 22, and the other of the field-effect transistors includes the fin 34 and the source/drain regions 42, 43.

Figure 10:
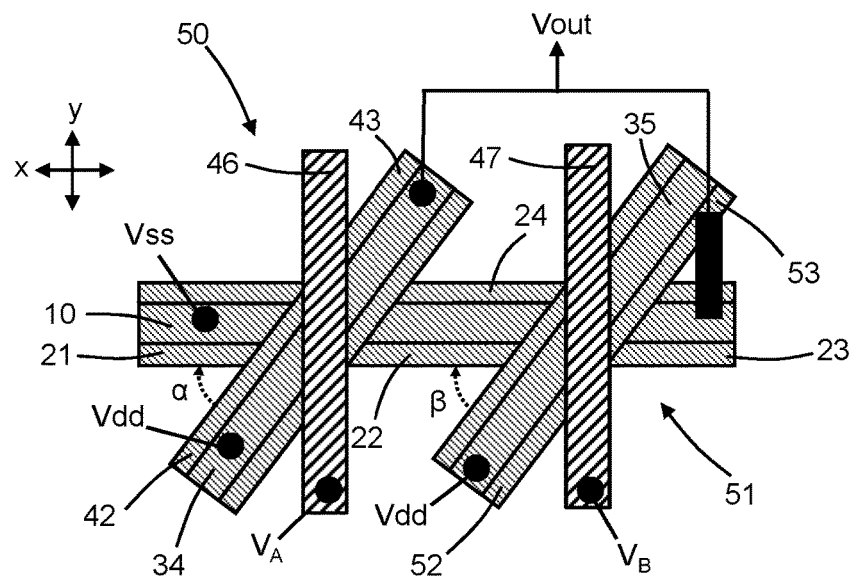
FIG. 10 is a top view of a circuit for a NAND logic gate built using the structure of FIGS. 9A, 9B, 9C in accordance with embodiments of the invention.

With reference to FIG. 10 in which like reference numerals refer to like features in FIGS. 9A, 9B, 9C and in accordance with embodiments of the invention, the process forming the device structure 50 may be used to concurrently fabricate another device structure 51 that is identical to the device structure 50. The device structure 51 is arranged adjacent to the device structure 50 on the substrate 10.

To that end, a functional gate structure 47 of the device structure 51 may be formed when the functional gate structure 46 is formed, and source/drain regions 23, 24 of the lower field-effect transistor of the device structure 51 may be grown from fin 12 when the source/drain regions 21, 22 are grown. The functional gate structure 47 is spaced along the length of the fin 12 from the functional gate structure 46, and the functional gate structure 47 is shared by the upper field-effect transistor and the lower field-effect transistor of the device structure 51. The source/drain region 22 of the device structure 50 and the source/drain region 24 of the device structure 51, which are both grown from the fin 12, are merged and coupled with each other. A fin 35 of the upper field-effect transistor of device structure 51 may be formed when the fin 34 is formed, and the source/drain regions 52, 53 of the upper field-effect transistor of device structure 51 may be epitaxially grown from the fin 35 when the source/drain regions 42, 43 are formed. The source/drain region 22 of the device structure 50 and the source/drain region 24 of the device structure 51 are centrally-located between the fin 34 and the fin 35.

The fin 34 intersects the fin 12 at an acute angle, α, and the fin 34 intersects the fin 12 at an acute angle, β. In an embodiment, the fin 35 may be aligned relative to, and spaced apart from, the fin 34 such that the fins 34, 35 intersect the fin 12 at respective acute angles, α and β, that are both positive angles (i.e., measured in a clockwise sense). In an embodiment, the fins 34, 35 may have a parallel arrangement and may therefore be aligned with equal inclinations (i.e., equal positive slopes) relative to the fin 12 such that the acute angles, α and β, are congruent (i.e., equal).

The device structures 50, 51 may be used to form a two-input terminal NAND logic gate in which voltage high is Logic true and voltage low is Logic false. In the representative embodiment of the NAND logic gate, the lower field-effect transistor in each of the device structures 50, 51 may be an n-type field-effect transistor (nFET) in which the source/drain regions 21, 22 and the source/drain regions 23, 24 have n-type conductivity and the upper field-effect transistor in each of the device structures 50, 51 may be a p-type field-effect transistor (pFET) in which the source/drain regions 42, 43 and source/drain regions 52, 53 have p-type conductivity.

Contacts, as diagrammatically indicated by the filled circles and filled bar in FIG. 10, are formed in the dielectric layer 44 and extend vertically through the dielectric layer 44 to the device structures 50, 51. The contacts may be composed of a conductor, such as tungsten (W), clad with a conductive liner (e.g., titanium nitride (TiN)), and are formed in contact openings formed by lithography and etching in the dielectric layer 44.

The source/drain region 21 of the lower field-effect transistor in the device structure 50 is connected by a contact with a ground power supply ($V_{SS}$) line. The source/drain region 42 of the upper field-effect transistor in the device structure 50 is connected by a contact with a positive supply voltage ($V_{DD}$) line. The source/drain region 52 of the upper field-effect transistor in the device structure 51 is connected by a contact with a positive supply voltage ($V_{DD}$) line. The source/drain region 23 of the lower field-effect transistor of the device structure 51 and the source/drain region 53 of the upper field-effect transistor in device structure 51 are connected together by a bar contact and are jointly connected by the bar contact with an output line, $V_{out}$. The source/drain region 43 of the upper field-effect transistor in device structure 50 is also connected by a contact with the output line, $V_{out}$. The functional gate structure 46 of the upper field-effect transistor in device structure 50 is connected with an input line, $V_A$, and the functional gate structure 47 of the upper field-effect transistor in device structure 51 is connected with an input line, $V_B$. The $V_{SS}$ line, $V_{DD}$ line, and input lines represent wires that are routed in the overlying metallization level(s) (not shown).

Figure 11:
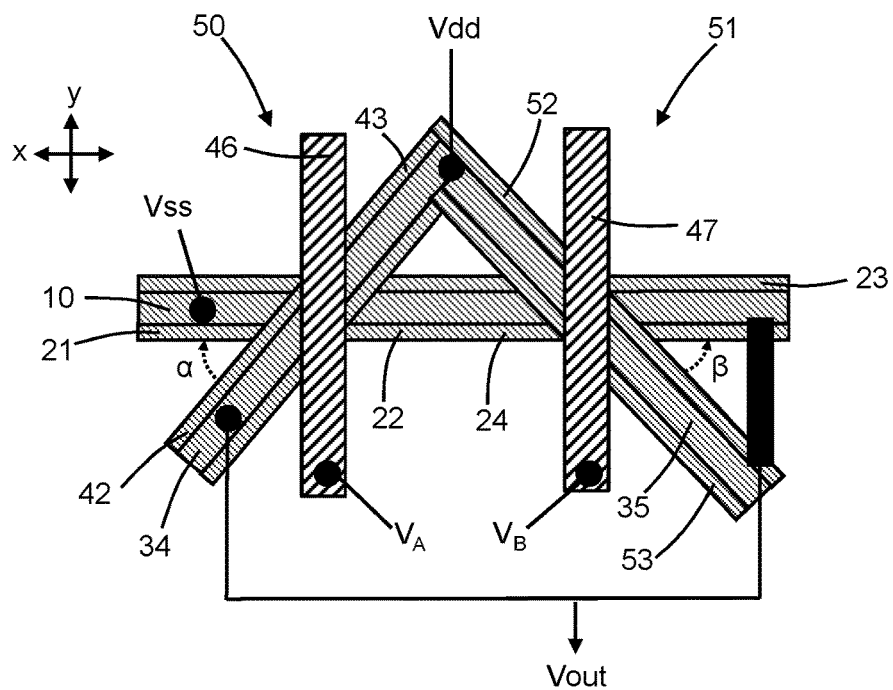
FIG. 11 is a top view of a circuit for a NAND logic gate built using the structure of FIGS. 9A, 9B, 9C in accordance with embodiments of the invention.

With reference to FIG. 11 in which like reference numerals refer to like features in FIG. 10 and in accordance with alternative embodiments of the invention, the fins 34, 35 associated with the upper-level field-effect transistors may be re-aligned such that the fin 35 intersects the fin 34 at a location between the functional gate structure 46 and the functional gate structure 47, as opposed to having a parallel inclined alignment. In an embodiment, the fin 34 intersects the fin 12 at an acute angle, α, that is a positive angle, and the fin 35 intersects the fin 12 at an acute angle, β, that is a negative angle (i.e., measured in a counterclockwise sense). In an embodiment, the fins 34, 35 may be aligned with respective positive and negative inclinations relative to the fin 12 that are equal (i.e., equal positive and negative slopes) such that the acute angles, α and β, have equal absolute values.

The source/drain region 21 of the lower field-effect transistor in the device structure 50 is connected by a contact with the $V_{SS}$ line. The source/drain region 43 of the upper field-effect transistor in device structure 50 and the source/drain region 52 of the upper field-effect transistor in device structure 51 are commonly connected by a contact with the $V_{dd}$ line. The source/drain region 23 of the lower field-effect transistor of the device structure 51 and the source/drain region 53 of the upper field-effect transistor in device structure 51 are connected together by a bar contact and are jointly connected by the bar contact with the output line, $V_{out}$. The source/drain region 42 of the upper field-effect transistor in device structure 50 is also connected by a contact with the output line, $V_{out}$. The functional gate structure 46 of the upper field-effect transistor in device structure 50 is connected with the input line, $V_A$, and the functional gate structure 47 of the upper field-effect transistor in device structure 51 is connected with the input line, $V_B$.

Figure 12:
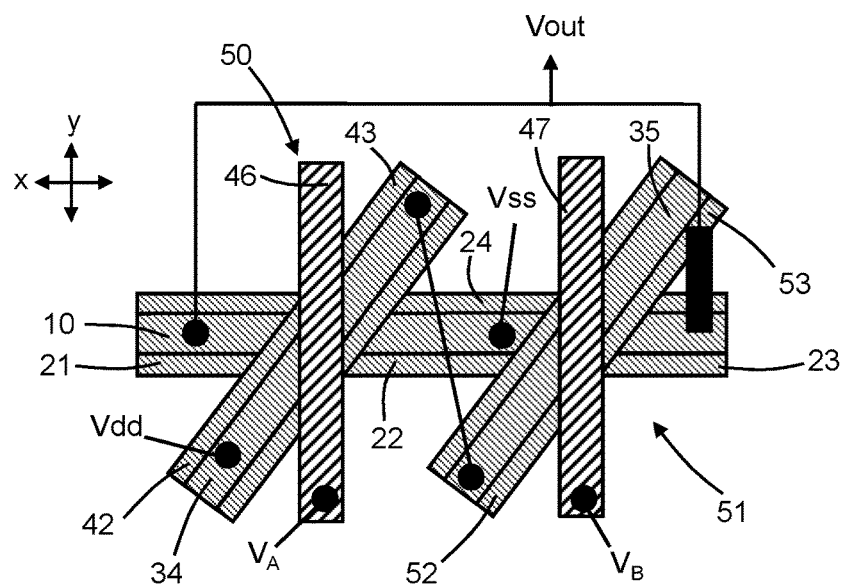
FIG. 12 is a top view of a circuit for a NOR logic gate built using the structure of FIGS. 9A, 9B, 9C in accordance with embodiments of the invention.

With reference to FIG. 12 in which like reference numerals refer to like features in FIG. 10 and in accordance with alternative embodiments of the invention, the device structures 50, 51 (FIG. 10) may be used to form a two-input terminal NOR logic gate in which voltage high is Logic true and voltage low is Logic false. In the representative embodiment of the NOR logic gate, the lower field-effect transistor in each of the device structures 50, 51 may be an n-type field-effect transistor (nFET) in which the source/drain regions 21, 22, 23 have n-type conductivity, and the upper field-effect transistor in each of the device structures 50, 51 may be a p-type field-effect transistor (pFET) in which the source/drain regions 42, 43 and source/drain regions 52, 53 have p-type conductivity.

The source/drain region 22 of the lower field-effect transistor in the device structure 50 and the source/drain region 24 of the lower field-effect transistor in the device structure 51 are connected by a contact with a ground power supply ($V_{SS}$) line. The source/drain region 42 of the upper field-effect transistor in the device structure 50 is connected by a contact with a positive supply voltage ($V_{DD}$) line. The source/drain region 22 of the lower field-effect transistor of the device structure 51 and the source/drain region 53 of the upper field-effect transistor in device structure 51 are connected together by a bar contact and are jointly connected by the bar contact with an output line, $V_{out}$. The source/drain region 21 of the lower field-effect transistor in device structure 50 is also connected by a contact with the output line, $V_{out}$. The functional gate structure 46 of the upper field-effect transistor in device structure 50 is connected with an input line, $V_A$, and the functional gate structure 47 of the upper field-effect transistor in device structure 51 is connected with an input line, $V_B$. The source/drain region 43 of the upper field-effect transistor in the device structure 50 and source/drain region 52 of the upper field-effect transistor in the device structure 51 are connected together by a wire and respective contacts connecting the source/drain regions 43, 52 with the connecting wire.

Figure 13:
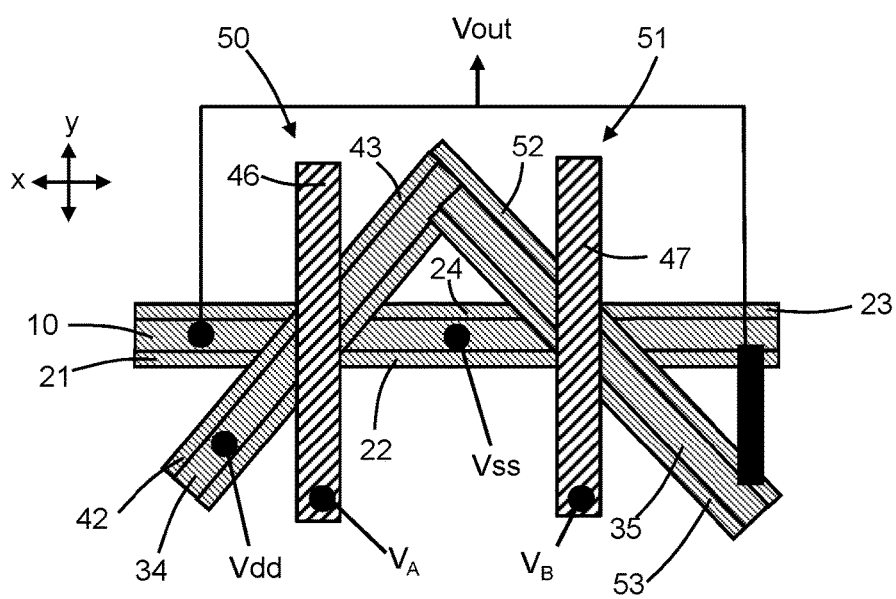
FIG. 13 is a top view of a circuit for a NOR logic gate built using the structure of FIGS. 9A, 9B, 9C in accordance with embodiments of the invention.

With reference to FIG. 13 in which like reference numerals refer to like features in FIG. 12 and in accordance with alternative embodiments of the invention, the device structures 50, 51 (FIG. 11) may be used to form a NOR logic gate having two input terminals. In the representative embodiment of the NOR logic gate, the lower field-effect transistor in each of the device structures 50, 51 may be an n-type field-effect transistor (nFET) in which the source/drain regions 21, 22 and the source/drain regions 23, 24 have n-type conductivity, and the upper field-effect transistor in each of the device structures 50, 51 may be a p-type field-effect transistor (pFET) in which the source/drain regions 42, 43 and the source/drain regions 52, 53 has p-type conductivity.

The source/drain region 22 of the lower field-effect transistor in the device structure 50 and the source/drain region 24 of the lower field-effect transistor in the device structure 51 is connected by a contact with the $V_{SS}$ line. The source/drain region 42 of the upper field-effect transistor in the device structure 50 is connected by a contact with the $V_{DD}$ line. The source/drain region 23 of the lower field-effect transistor of the device structure 51 and the source/drain region 53 of the upper field-effect transistor in device structure 51 are connected together by a bar contact and are jointly connected by the bar contact with the output line, $V_{out}$. The source/drain region 21 of the lower field-effect transistor in device structure 50 is also connected by a contact with the output line, $V_{out}$. The functional gate structure 46 of the upper field-effect transistor in device structure 50 is connected with the input line, $V_A$, and the functional gate structure 47 of the upper field-effect transistor in device structure 51 is connected with the input line, $V_B$. The source/drain region 43 of the upper field-effect transistor in the device structure 50 and source/drain region 52 of the upper field-effect transistor in the device structure 51 are directly connected together due to the inclinations of the fins 34, 35 resulting in their intersection between the functional gate structure 46 and the functional gate structure 47.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a first field-effect transistor including a first section of a first fin, a first source/drain region, and a second source/drain region, the first section of the first fin arranged between the first source/drain region and the second source/drain region of the first field-effect transistor;
   a second field-effect transistor including a second fin arranged over the first section of the first fin, a first source/drain region, and a second source/drain region; and
   a first functional gate structure having an overlapping arrangement with the first section of the first fin and an overlapping arrangement with a section of the second fin arranged between the first source/drain region and the second source/drain region of the second field-effect transistor,
   wherein the first fin is aligned at an acute angle relative to the second fin.

2. The structure of claim 1 further comprising:
   one or more dielectric layers arranged between the first fin and the second fin.

3. A structure comprising:
   a first field-effect transistor including a first section of a first fin, a first source/drain region, and a second source/drain region, the first section of the first fin arranged between the first source/drain region and the second source/drain region of the first field-effect transistor;
   a second field-effect transistor including a second fin arranged over the first section of the first fin, a first source/drain region, and a second source/drain region;
   a first functional gate structure having an overlapping arrangement with the first section of the first fin and an overlapping arrangement with a section of the second fin arranged between the first source/drain region and the second source/drain region of the second field-effect transistor;

a third field-effect transistor including a second section of the first fin, a first source/drain region, and a second source/drain region;

a fourth field-effect transistor including a third fin arranged over the second section of the first fin, a first source/drain region, and a second source/drain region; and a second functional gate structure having an overlapping arrangement with the second section of the first fin and an overlapping arrangement with a section of the third fin between the first source/drain region and the second source/drain region of the fourth field-effect transistor.

4. The structure of claim 3 wherein the first source/drain region of the third field-effect transistor is continuous with the second source/drain region of the first field-effect transistor, and the first source/drain region of the third field-effect transistor and the second source/drain region of the first field-effect transistor are arranged between the second fin and the third fin.

5. The structure of claim 3 wherein the second fin is aligned at a first acute angle relative to the first fin, and the third fin is aligned at a second acute angle relative to the first fin.

6. The structure of claim 5 wherein the second fin is aligned parallel with the third fin, and the first acute angle of the second fin is equal to the second acute angle of the third fin.

7. The structure of claim 5 wherein the second fin intersects the third fin, and the first acute angle of the second fin is a positive angle and the second acute angle of the third fin is a negative angle.

8. The structure of claim 3 wherein the second fin is aligned parallel with the third fin, the first source/drain region of the first field-effect transistor is connected with a ground power supply ($V_{SS}$) line, the first source/drain region of the second field-effect transistor and the first source/drain region of the fourth field-effect transistor are connected with a positive power supply ($V_{DD}$) line, and the second source/drain region of the fourth field-effect transistor is coupled with the second source/drain region of the third field-effect transistor.

9. The structure of claim 8 wherein the first functional gate structure is connected with a first input line, the second functional gate structure is connected with a second input line, and the second source/drain region of the second field-effect transistor, the second source/drain region of the third field-effect transistor, and the second source/drain region of the fourth field-effect transistor are coupled with an output line.

10. The structure of claim 3 wherein the second fin is aligned to intersect the third fin so that the second source/drain region of the second field-effect transistor and the first source/drain region of the fourth field-effect transistor are connected, the first source/drain region of the first field-effect transistor is connected with a ground power supply ($V_{SS}$) line, the second source/drain region of the second field-effect transistor and the first source/drain region of the fourth field-effect transistor are connected with a positive power supply ($V_{DD}$) line, and the second source/drain region of the fourth field-effect transistor is coupled with the first source/drain region of the third field-effect transistor.

11. The structure of claim 10 wherein the first functional gate structure is connected with a first input line, the second functional gate structure is connected with a second input line, and the first source/drain region of the second field-effect transistor, the second source/drain region of the third field-effect transistor, and the second source/drain region of the fourth field-effect transistor are coupled with an output line.

12. The structure of claim 3 wherein the second fin is aligned parallel with the third fin, the second source/drain region of the first field-effect transistor is connected with a ground power supply ($V_{SS}$) line, the first source/drain region of the second field-effect transistor is connected with a positive power supply ($V_{DD}$) line, the second source/drain region of the second field-effect transistor is connected with the first source/drain region of the fourth field-effect transistor, and the second source/drain region of the fourth field-effect transistor is coupled with the second source/drain region of the third field-effect transistor.

13. The structure of claim 12 wherein the first functional gate structure is connected with a first input line, the second functional gate structure is connected with a second input line, and the first source/drain region of the first field-effect transistor, the second source/drain region of the third field-effect transistor, and the second source/drain region of the fourth field-effect transistor are coupled with an output line.

14. The structure of claim 3 wherein the second fin is aligned to intersect the third fin so that the second source/drain region of the second field-effect transistor and the first source/drain region of the fourth field-effect transistor are connected, the second source/drain region of the first field-effect transistor is connected with a ground power supply ($V_{SS}$) line, the first source/drain region of the second field-effect transistor is connected with a positive power supply ($V_{DD}$) line, and the second source/drain region of the fourth field-effect transistor is coupled with the second source/drain region of the third field-effect transistor.

15. The structure of claim 14 wherein the first functional gate structure is connected with a first input line, the second functional gate structure is connected with a second input line, and the first source/drain region of the first field-effect transistor, the second source/drain region of the third field-effect transistor, and the second source/drain region of the fourth field-effect transistor are coupled with an output line.

16. The structure of claim 3 wherein the first fin is aligned at an acute angle relative to the second fin.

17. A method comprising:
forming a first fin;
epitaxially growing a first source/drain region and a second source/drain region of a first field-effect transistor from the first fin;
forming a second fin over the first fin;
epitaxially growing a first source/drain region and a second source/drain region of a second field-effect transistor from the second fin; and
forming a functional gate structure that overlaps with a section of the first fin between the first source/drain region and the second source/drain region of the first field-effect transistor, and that overlaps with a section of the second fin between the first source/drain region and the second source/drain region of the second field-effect transistor,
wherein the first fin is aligned at an acute angle relative to the second fin.

18. The method of claim 17 wherein the first source/drain region and the second source/drain region are epitaxially grown from the first fin before the second fin is formed.

19. The method of claim 17 wherein the first field-effect transistor is covered by a dielectric layer, and forming the second fin over the first fin comprises:

transferring a semiconductor layer from a silicon-on-insulator substrate to the dielectric layer; and patterning the semiconductor layer to form the second fin.

20. The method of claim 17 wherein forming the functional gate structure comprises:

forming a first sacrificial gate structure that overlaps with the section of the first fin;

forming a second sacrificial gate structure that that overlaps with the section of the first fin and that is stacked with the first sacrificial gate structure;

concurrently replacing the first sacrificial gate structure and the second sacrificial gate structure with the functional gate structure.

\* \* \* \* \*